(12) United States Patent
Bickford et al.

(10) Patent No.: US 8,694,936 B1
(45) Date of Patent: Apr. 8, 2014

(54) TERMINAL METAL CONNECTION INSPECTION

(71) Applicant: International Business Machines Corporation, Armonk, NY (US)

(72) Inventors: Jeanne P. S. Bickford, Essex Junction, VT (US); Donald S. Kent, Essex Junction, VT (US); Gerard John Nuzback, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/736,631

(22) Filed: Jan. 8, 2013

(51) Int. Cl.
*G06F 17/50* (2006.01)

(52) U.S. Cl.
USPC .......................................... 716/112; 716/137

(58) Field of Classification Search
USPC ................................................ 716/112, 137
See application file for complete search history.

(56) References Cited

U.S. PATENT DOCUMENTS

| | | | |
|---|---|---|---|
| 5,581,475 A | 12/1996 | Majors | |
| 6,971,082 B2 | 11/2005 | Shiratori | |
| 7,016,794 B2 | 3/2006 | Schultz | |
| 7,146,588 B1 | 12/2006 | Marathe et al. | |
| 7,603,641 B2 | 10/2009 | Lin | |
| 7,971,171 B2 | 6/2011 | Keinert et al. | |
| 8,219,953 B2 | 7/2012 | Jain et al. | |
| 2006/0101367 A1* | 5/2006 | Fujita et al. | 716/10 |
| 2008/0086708 A1 | 4/2008 | Rittman | |

OTHER PUBLICATIONS

Filippi et al., Electromigration in AlCu lines: comparion of Dual Damascene and metal reaction ion etching, Thin Solid Films 388, 1001, 303-314, Feb. 2001.

* cited by examiner

*Primary Examiner* — Jack Chiang
*Assistant Examiner* — Brandon Bowers
(74) *Attorney, Agent, or Firm* — Richard M. Kotulak; Hoffman Warnick LLC (57) ABSTRACT

Various embodiments include computer-implemented methods, computer program products and systems for terminal metal connector inspection. In some embodiments, a computer-implemented method for identifying a set of critical terminal metal connectors (TMCs) in an integrated circuit (IC) layout includes: identifying a group of necessary terminal metal connectors (TMCs) in the IC layout to form a first portion of the set of critical TMCs; forming a rule including a limit on a number of redundant connections that can be noncompliant between each terminal metal connector (TMC) and a connecting surface in the IC layout without impacting a circuit parameter; and inspecting at least one of the IC layout or the connecting surface to identify each TMC that violates the rule, wherein each identified TMC that violates the rule forms a second portion of the set of critical TMCs.

17 Claims, 6 Drawing Sheets

TERMINAL METAL CONNECTION INSPECTION

TECHNICAL FIELD

Aspects of the invention relate generally to integrated circuits. More particularly, various aspects of the invention relate to identifying critical components in integrated circuit layouts.

BACKGROUND

In many conventional integrated circuit (IC) layouts, a number of IC chips are connected using terminal metal connections (TMCs). Packaged IC chips are also connected to boards using TMCs. The term "terminal metal connection" is also referred to as a controlled collapse chip connector (C4) in the art, and as used herein, a TMC can also refer to a wirebond connection or any other type of connection between circuit components and/or interconnect structures (e.g., cards and/or boards). The number of TMCs in some IC layouts is so large that significant yield loss occurs if all non-conforming TMCs are discarded Power and ground TMCs are designed with redundancy so products will function properly without reliability issues if some TMCs do not comply fully with inspection criteria. However, some TMCs are critical to system functionality and reliability, and the likelihood of a failure in an IC formed from that layout can be undesirably high if these critical TMCs do not fully comply with all test criteria.

BRIEF SUMMARY

Various embodiments include computer-implemented methods, computer program products and systems for terminal metal connector inspection. In some embodiments, a computer-implemented method for identifying a set of critical terminal metal connectors (TMCs) in an integrated circuit (IC) layout includes: identifying a group of necessary terminal metal connectors (TMCs) in the IC layout to form a first portion of the set of critical TMCs; forming a rule including a limit on a number of redundant connections that can be noncompliant between each terminal metal connector (TMC) and a connecting surface in the IC layout without impacting a circuit parameter; and inspecting at least one of the IC layout or the connecting surface to identify each TMC that violates the rule, wherein each identified TMC that violates the rule forms a second portion of the set of critical TMCs.

A first aspect includes a computer-implemented method for identifying a set of critical terminal metal connectors (TMCs) in an integrated circuit (IC) layout, the method including: identifying a group of necessary terminal metal connectors (TMCs) in the IC layout to form a first portion of the set of critical TMCs; forming a rule including a limit on a number of redundant connections that can be noncompliant between each terminal metal connector (TMC) and a connecting surface in the IC layout without impacting a circuit parameter; and inspecting at least one of the IC layout or the connecting surface to identify each TMC that violates the rule, wherein each identified TMC that violates the rule forms a second portion of the set of critical TMCs.

A second aspect of the invention includes a computer program product including program code, which when executed on at least one computing device, causes the at least one computing device to identify a set of critical terminal metal connectors (TMCs) in an integrated circuit (IC) layout by performing actions including: identifying a group of necessary terminal metal connectors (TMCs) in the IC layout to form a first portion of the set of critical TMCs; forming a rule including a limit on a number of redundant connections that can be noncompliant between each terminal metal connector (TMC) and a connecting surface in the IC layout without impacting a circuit parameter; and inspecting at least one of the IC layout or the connecting surface to identify each TMC that violates the rule, wherein each identified TMC that violates the rule forms a second portion of the set of critical TMCs.

A third aspect of the invention includes a system including: at least one computing device configured to identify a set of critical terminal metal connectors (TMCs) in an integrated circuit (IC) layout by performing actions including: identifying a group of necessary terminal metal connectors (TMCs) in the IC layout to form a first portion of the set of critical TMCs; forming a rule including a limit on a number of redundant connections that can be noncompliant between each terminal metal connector (TMC) and a connecting surface in the IC layout without impacting a circuit parameter; and inspecting at least one of the IC layout or the connecting surface to identify each TMC that violates the rule, wherein each identified TMC that violates the rule forms a second portion of the set of critical TMCs.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As described herein, in many conventional integrated circuit (IC) layouts, a number of IC chips are connected using terminal metal connections (TMCs) and packaged IC chips are connected to a board using TMCs. The term "terminal metal connection" is also referred to as a controlled collapse chip connector (C4) in the art. As noted, the number of TMCs in some IC layouts or packaged IC layouts is so large that significant yield loss occurs if all non-conforming TMCs are discarded. Power and ground TMCs are designed with redundancy so products will function properly without reliability issues when one or more TMCs do not comply fully with inspection criteria. However, some TMCs are critical to system functionality and reliability, and the likelihood of a failure in an IC formed from that layout that is undesirably high if these TMCs do not fully comply with all test criteria.

For the purposes of the discussion of the aspects of the invention, the TMC connections between an IC chip and connecting surface (e.g., substrate, laminate, or board) are described. However, the approaches described herein can similarly be applied to the connection of an IC chips with another IC chip, a packaged IC chip to a board, connection of cards on boards, etc. The various approaches described herein can also be applied to redundant signal connections in addition to the power and ground connections described herein.

In order to address the issues associated with conventional IC layout testing, various embodiments of the invention include computer-implemented methods, computer program products, and computer systems which can determine a set of "critical" or "must-have" TMCs, so that those TMCs may be tested to ensure compliance with test requirements and effective operation of an IC formed from the IC layout.

Various particular embodiments include a computer-implemented method for identifying a set of critical terminal metal connectors (TMCs) in an integrated circuit (IC) layout. The method can include: identifying a group of necessary terminal metal connectors (TMCs) in the IC layout to form a first portion of the set of critical TMCs; forming a rule including a limit on a number of redundant connections that can be noncompliant between each terminal metal connector (TMC) and a connecting surface in the IC layout without impacting a circuit parameter; and inspecting at least one of the IC layout or the connecting surface to identify each TMC that violates the rule, wherein each identified TMC that violates the rule forms a second portion of the set of critical TMCs.

Various additional particular embodiments include a computer program product including program code, which when executed on at least one computing device, causes the at least one computing device to identify a set of critical terminal metal connectors (TMCs) in an integrated circuit (IC) layout by performing actions including: identifying a group of necessary terminal metal connectors (TMCs) in the IC layout to form a first portion of the set of critical TMCs; forming a rule including a limit on a number of redundant connections that can be noncompliant between each terminal metal connector (TMC) and a connecting surface (e.g., substrate, laminate, or board) in the IC layout without impacting a circuit parameter; and inspecting at least one of the IC layout or the connecting surface to identify each TMC that violates the rule, wherein each identified TMC that violates the rule forms a second portion of the set of critical TMCs.

Various additional particular embodiments include a system including: at least one computing device configured to identify a set of critical terminal metal connectors (TMCs) in an integrated circuit (IC) layout by performing actions including: identifying a group of necessary terminal metal connectors (TMCs) in the IC layout to form a first portion of the set of critical TMCs; forming a rule including a limit on a number of redundant connections that can be noncompliant between each terminal metal connector (TMC) and a connecting surface (e.g., substrate, laminate, or board) in the IC layout without impacting a circuit parameter; and inspecting at least one of the IC layout or the connecting surface to identify each TMC that violates the rule, wherein each identified TMC that violates the rule forms a second portion of the set of critical TMCs.

Figure 1:
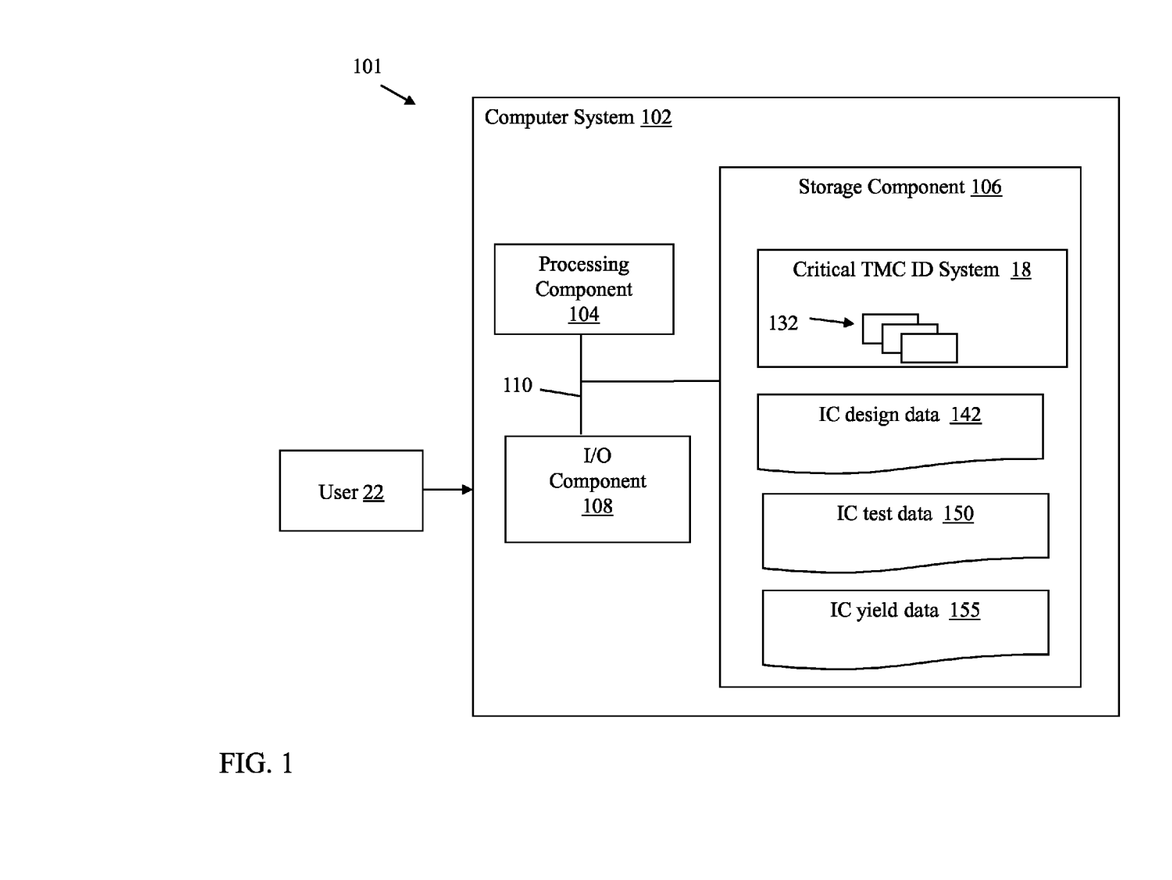
FIG. 1 shows a schematic environment for implementing a critical terminal metal connection (TMC) identification program according to various embodiments.

Turning to the drawings, FIG. 1 depicts an illustrative environment 101 for identify a set of critical terminal metal connectors (TMCs) in an integrated circuit (IC) layout according to embodiments. To this extent, the environment 101 includes a computer system 102 that can perform a process described herein in order to identify critical terminal metal connectors in integrated circuits. In particular, the computer system 102 is shown as including a critical TMC identification (ID) system 18, which makes computer system 102 operable to identify critical TMCs in an IC layout by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the critical TMC ID system 18, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a user (e.g., a human or other user) 22 to interact with the computer system 102 and/or one or more communications devices to enable a system user 22 to communicate with the computer system 102 using any type of communications link. To this extent, the critical TMC ID system 18 can manage a set of interfaces (e.g., graphical user interface(s), application program interface, etc.) that enable human and/or system users 22 to interact with the critical TMC ID system 18. Further, the critical TMC ID system 18 can manage (e.g., store, retrieve, create, manipulate, organize, present, etc.) data, such as IC design and/or test data (including wafer and chip-level data) using any solution.

In any event, the computer system 102 can comprise one or more general purpose computing articles of manufacture (e.g., computing devices) capable of executing program code, such as the critical TMC ID system 18, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the critical TMC ID system 18 can be embodied as any combination of system software and/or application software.

Further, the critical TMC ID system 18 can be implemented using a set of modules 132. In this case, a module 132 can enable the computer system 102 to perform a set of tasks used by the critical TMC ID system 18, and can be separately developed and/or implemented apart from other portions of the critical TMC ID system 18. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of critical TMC ID system 18 fixed thereon (e.g., one or more modules 132). However, it is understood that the computer system 102 and critical TMC ID system 18 are only representative of various possible equivalent computer systems that may perform a process described herein. To this extent, in other embodiments, the functionality provided by the computer system 102 and critical TMC ID system 18 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as IC design data 142, IC test data 150 and/or IC yield data 155 using any solution. For example, the computer system 102 can generate and/or be used to retrieve IC design data 142, IC test data 150 and/or IC yield data 155 from one or more data stores, receive IC design data 142, IC test data 150 and/or IC yield data 155 from another system, send IC design data 142, IC test data 150 and/or IC yield data 155 to another system, etc. IC design data 142 can include data about a layout of an IC, including design parameters such as spacings, tolerances, dimensions (e.g., wire widths), intended current levels, etc., IC test data 150 can include data gathered from testing (either through simulation or physical testing of product(s)) at least a portion of an IC to verify one or more of the design parameters, and IC yield data 155 can include data such as predicted and/or actual yield data about one or more production processes in the formation of the IC (including chip-level, wafer-level, and/or wafer-level data) or a component of the IC (e.g., one or more chip packages).

While shown and described herein as methods, systems, and computer program products for identifying critical TMCs in an IC layout, it is understood that aspects of the invention further provide various alternative embodiments. For example, in one embodiment, the invention provides a computer program fixed in at least one computer-readable medium, which when executed, enables a computer system to identifying critical TMCs in an IC layout. To this extent, the computer-readable medium includes program code, such as the critical TMC ID system 18 (FIG. 1), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the critical TMC ID system 18 (FIG. 1), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for critical TMC identification in an IC layout. In this case, a computer system, such as the computer system 102 (FIG. 1), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

Figure 2:
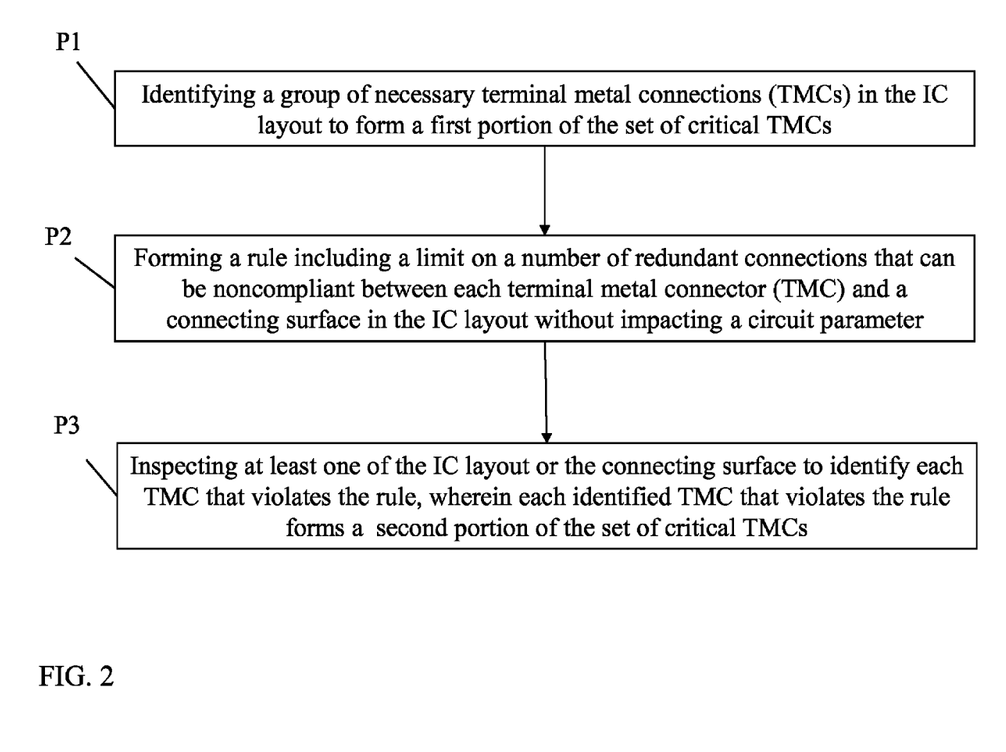
FIG. 2 shows a flow diagram depicting a process according to various embodiments.

FIG. 2 shows a flow diagram illustrating a process of identifying a set of critical terminal metal connections (TMCs) in an integrated circuit (IC) layout according to various embodiments of the invention. The process can include:

Process P1: identifying a group of necessary terminal metal connectors (TMCs) in the IC layout to form a first portion of the set of critical TMCs. This process can also be referred to as identifying "must-have" TMCs in the IC layout. In various embodiments, identifying the necessary TMCs includes using at least one of three approaches:

A) identifying each necessary TMC using an exposure limit approach (e.g., determining a maximum allowed current per TMC);

B) identifying each necessary TMC using an electrical analysis approach; and/or

C) identifying each necessary TMC using a minimum metal width approach (e.g., identify electromigration exposure associated with an underlying metal line).

Each of these three approaches can be performed in a similar manner, except that the parameter (exposure limit, electrical analysis limit, or metal width) varies. Each current exposure limit represents the current exposure limit for the TMC. For the purposes of illustrating the various embodiments herein, the current exposure limit of the combined underlying metal and TMC is simply referred to as the current exposure limit of each of the TMCs. Each current exposure limit can be determined through conventional electrical analysis techniques and/or according to predetermined values assigned to each TMC.

Figure 3:
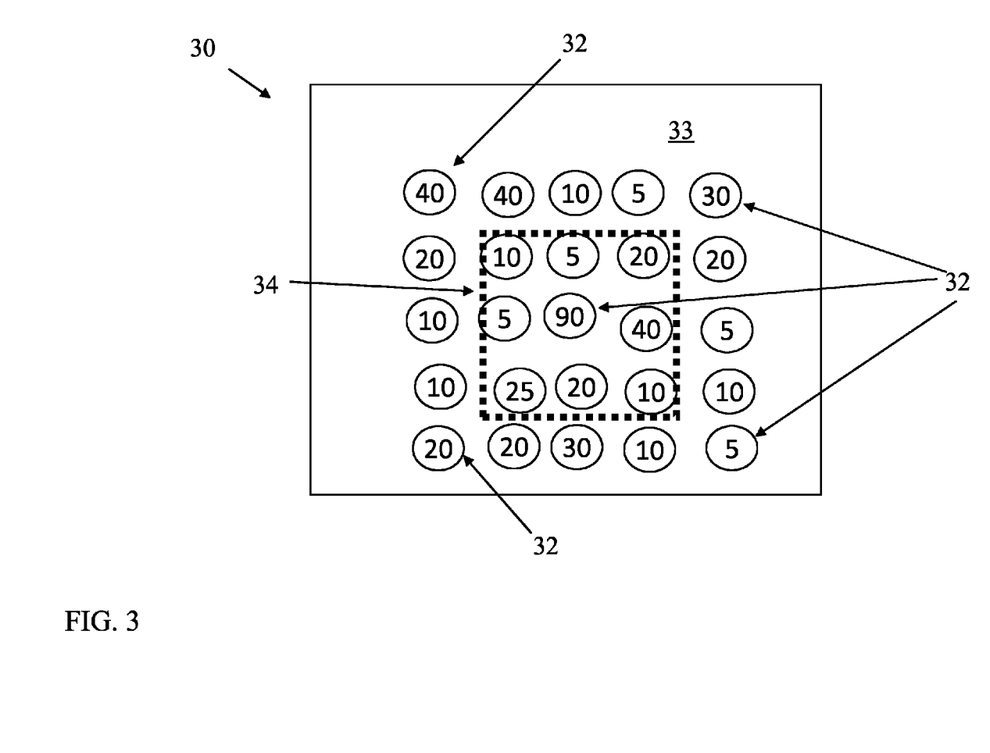
FIGS. 3-5 show illustrative schematic depictions of integrated circuit (IC) layouts and processes for identifying critical TMCs according to various embodiments.
Figure 4:
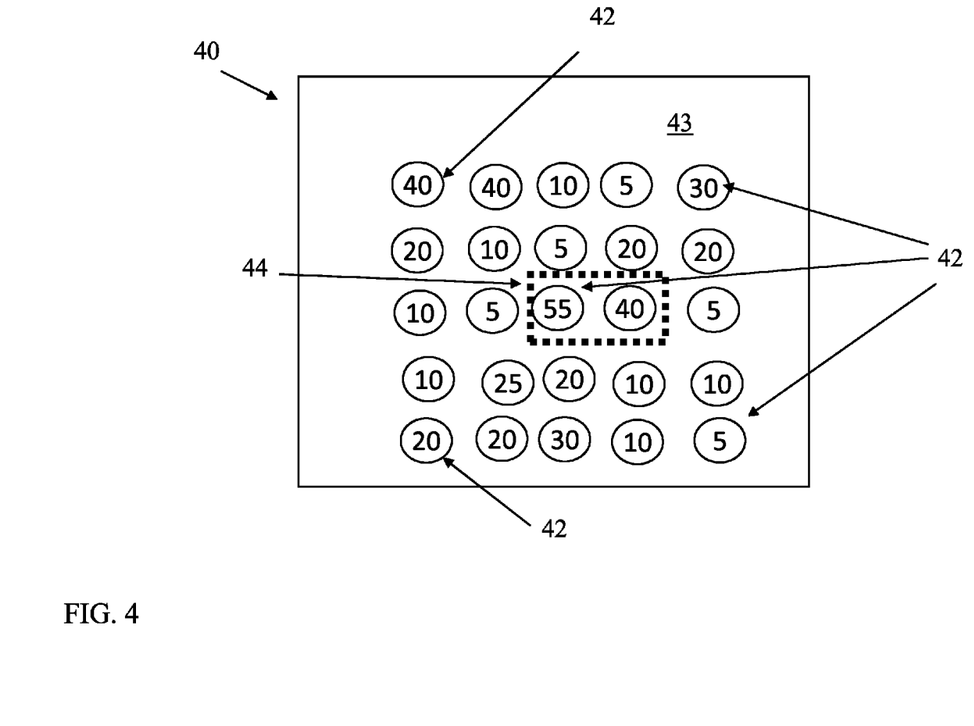
Figure 5:
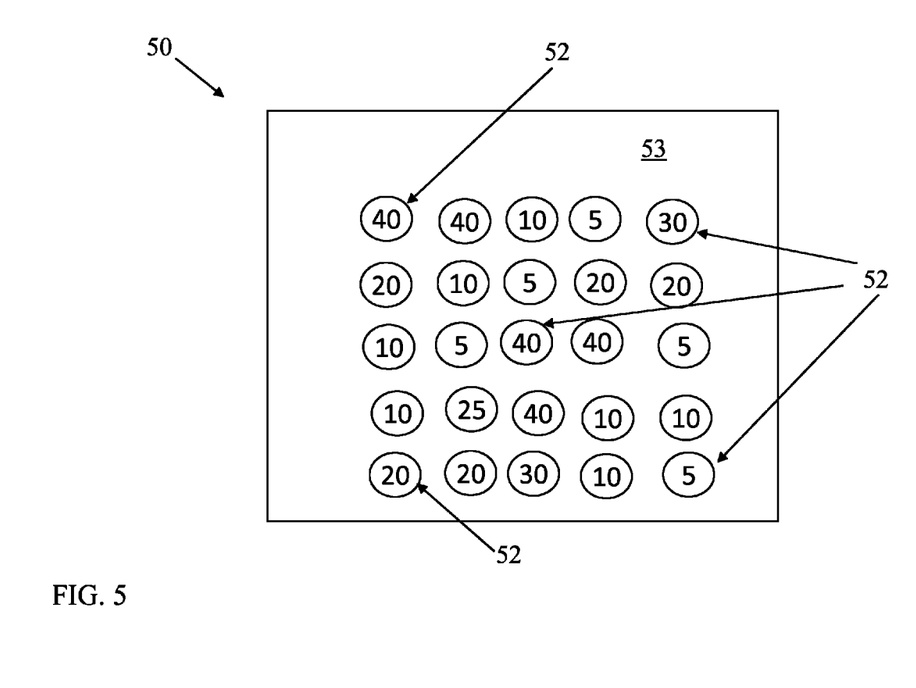

FIGS. 3-5 illustrate several schematic IC layouts 30, 40, 50 and illustrative identification processes according to various embodiments of the invention. FIGS. 3-5 illustrate using the exposure limit approach to identify necessary ("must-have") TMCs in IC layouts. As shown in FIG. 3, a plurality of TMCs 32 (selectively labeled for clarity of illustration) are schematically shown IC layout 30 connected to a connecting surface 33, which in this case is the surface of an integrated circuit (IC) chip. In the illustrative examples of FIGS. 3-5, TMCs are shown in contact with IC chip surfaces, however, it is understood that the principles of these examples can be applied to other connecting surfaces shown and described herein. In the remaining description of FIGS. 3-5, the connecting surface 33 is referred to as a chip surface 33 or IC chip surface 33. The sum of the current (in mili-amps, mA) of any adjacent pair of TMCs has been calculated, where the individual current value for each TMC is summed with each of the adjacent TMCs 32

(e.g., 40, 40, 10, 5 and 30 in the top row). In the example shown in FIG. 3, if the current of an adjacent TMC pair, 32, exceeds a predetermined limit allowed limit (e.g., in this case, 90 mA) all adjacent TMC connections are deemed as critical ("must have"), and required to be fully compliant with a set of predetermined test requirements.

In the example in FIG. 3, all TMC connections highlighted as being within the border 34 are required to be fully compliant to all predetermined test requirements. As will be apparent to one skilled in the art, the use of adjacent TMCs is provided merely as an example of how current (current limit) could be used to designate critical TMCs. Power bus design within the IC layout 30 can dictate groups of TMCs that are of concern from a current carrying standpoint or criteria can be set for individual TMCs. These groups may include, but are not limited to, linear group arrangements and/or groups of three or more TMCs.

In the examples shown in FIGS. 3-5, the current limit for adjacent pairs of TMCs 32, 42, 52, respectively) has been set to 90 mA based upon both electrical analysis and analysis of the current carrying capacity of the metal line under the TMC (32, 42, 52, respectively). As is known in the art, allowed current can be determined using electromigration analysis for the metal line under the TMCs that connects adjacent TMCs and creates TMC redundancy, and for the TMC connections to the chip surface (33 in FIG. 3; 43 in FIG. 4; 53 in FIG. 5). Based upon this electromigration analysis, the maximum allowed current carrying capacity for both the underlying metal line and the TMC (32, 42, 52) are determined. If one TMC (32, 42, 52) is not fully compliant with TMC test criteria (e.g., the connection is missing, undersized, has incomplete plating, includes an imperfection or defect, or includes another allowed deviation from specified TMC inspection requirements), the current from the noncompliant TMC will pass through an adjacent TMC (32, 42, 52).

As noted, in the example in FIG. 3, the maximum allowed current for each adjacent pair of TMCs has been set at 90 mA. As is known in the art, the impact of nonconforming TMCs will vary as a function of technology, power bus design style, and amount of current intended to be carried through the TMCs. It is further understood that the techniques described herein can be applied to cases where more than the immediately underlying line is considered. Accordingly, the specific allowed combinations of TMCs can be evaluated and encoded within each technology and power bus design style. Each product (IC product) can be evaluated with an electrical analysis tool to determine the maximum current that could be applied to each TMC (assuming that all TMC connections are substantially ideal). One or more pairs of TMCs (e.g., combinations of adjacent TMCs) are identified and evaluated to ensure that they are able to handle increased current without functionality or reliability exposure when an adjacent TMC is noncompliant (and unable to pass the expected current to the power bus).

In the example in FIG. 3, the current level of for each TMC pair has been set to 90 mA or less. In this example scenario, if the current level of any adjacent TMC pair, 32 is greater than 90 mA, all neighboring TMCs in the layout must be fully compliant to test criteria. As shown in the example of FIG. 3, the current exposure limit for each TMC pair is set to 90 mA. Results of electrical analysis at the four corners of the layout 30 (from top left clockwise to bottom left) are 40 mA, 30 mA, 5 mA and 20 mA, respectively. In various embodiments, the current exposure limit approach includes setting a threshold current exposure limit for one or more TMCs 32 in the IC layout 30, determining whether one or more TMCs 32 exceed the threshold current exposure limit, and identifying the TMCs 32 that meet or exceed the threshold as necessary (must-have) TMCs. The method can further include identifying each immediately adjacent TMC 32 as necessary, e.g., all TMCs that are immediately next to the TMC that exceeds the threshold current exposure limit. In one example, as shown in FIG. 3, the threshold current exposure limit is equal to 90 mA. Because the central TMC 32 has a current exposure level of 90 mA, which meets the threshold current exposure limit (90 mA), the sum of this TMC with all adjacent TMCs will exceed the threshold current exposure limit (90) and the central TMC 32 is identified as a necessary TMC. and so are each of the immediately adjacent TMCs, identified by border 34 in FIG. 3.

In an alternative embodiment, illustrated in FIG. 4, an IC layout 40 is shown including a plurality of TMCs 42 connected with a chip surface (connecting surface) 43. The sum of the current (in mili-amps, mA) of any adjacent pair of TMCs has been calculated, where the individual current value for each TMC is summed with each of the adjacent TMCs to determine the associated current exposure limits, as described herein. In this case, identifying the necessary TMCs includes establishing a threshold current exposure limit (e.g., 90 mA) and evaluating pairs of immediately adjacent TMCs to determine whether the combined current threshold of the pair exceeds the threshold current exposure limit. As shown in this example, the centermost TMC has a current exposure level of 55 mA, and the TMC to the immediate right of that centermost TMC has a current exposure level of 40 mA. Combined, these two immediately adjacent TMCs have a current exposure level of 95 mA, which exceeds the 90 mA threshold. In this circumstance, both TMCs inside the dashed border 44 are marked as "necessary".

FIG. 5 shows an example IC layout 50, where TMCs 52 (connected with chip surface 53) do not violate the current exposure rules discussed with respect to FIG. 3 or 4. In this case, none of the TMCs 52 individually, nor any pair of immediately adjacent TMCs, exceed the threshold current exposure limit of 90 mA. In this case, none of the TMCs 52 is considered necessary ("must-have") using the current exposure limit approach.

Figure 6:
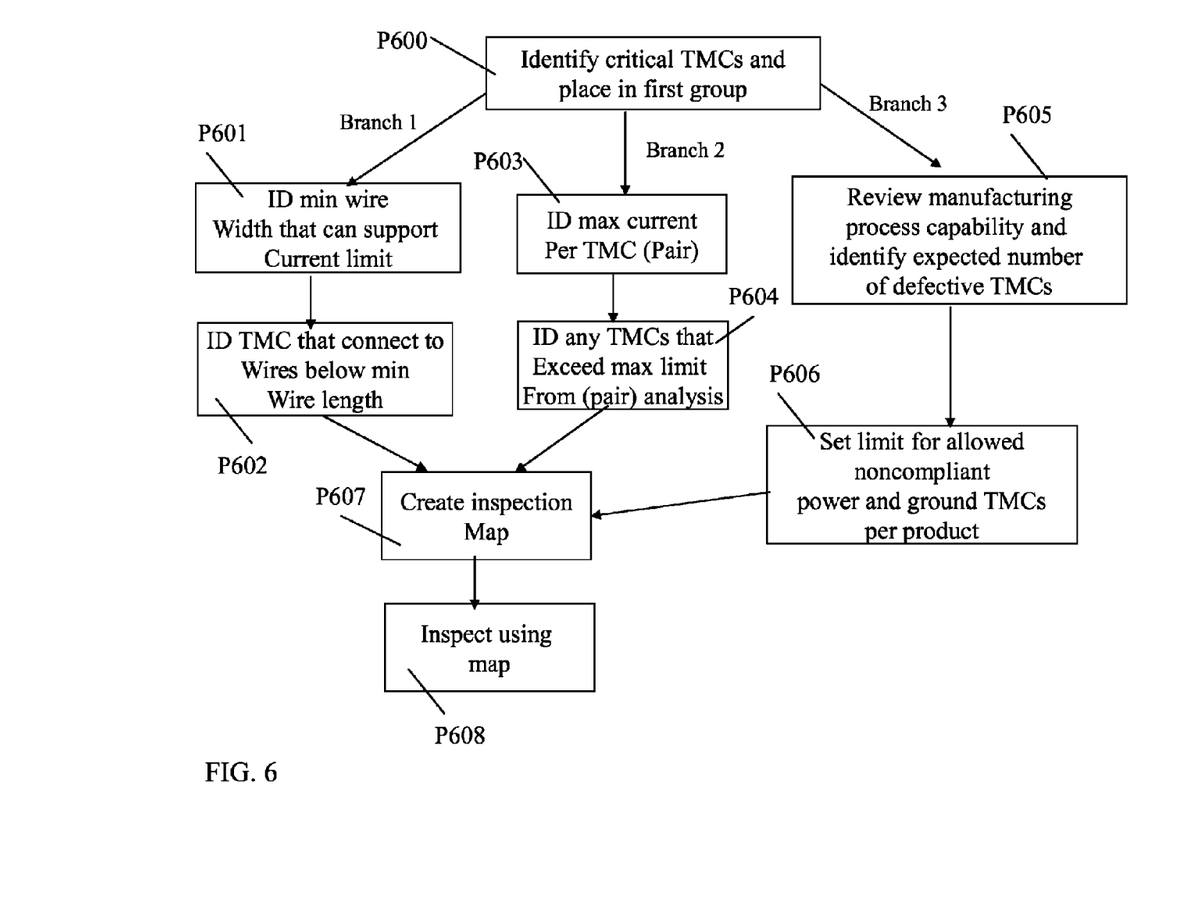
FIG. 6 shows a flow diagram depicting a process according to various embodiments.

FIG. 6 shows an illustrative flow diagram including a plurality of processes that can be used to identify the necessary TMCs in an IC layout. The processes can include:

Process P600: Identifying critical (must have) TMCs and placing those critical TMCs in a first group (e.g., removing from further consideration);

In Branch 1:

Process P601: Identifying a minimum wire width in the IC layout that can support a predetermined current exposure limit (in mA); and Process P602: Identifying TMC(s) that connect to wires that are below the minimum wire width.

In an alternative (or complementary approach), in Branch 2:

Process P603: Identifying a maximum exposure current for one or more (e.g., a singular or a pair of adjacent) TMC(s); and Process P604: Identifying TMC(s) that exceed the maximum exposure limit using the pairing (or individual) approach.

In an alternative (or complementary approach), in Branch 3:

Process P605: Review manufacturing process capability and identify the expected number of defective TMCs; and Process P606: Setting a limit for allowed noncompliant (e.g., missing, undersized, incomplete plating, imperfection, defect, or other allowed anomaly to the specified TMC inspection requirements) power and/or ground TMCs that will be implemented on each individual IC product (e.g., on an IC design at wafer/die inspection, module/substrate inspection, or board level).

All three Branches lead to the following:

Process P607: Creating an inspection map (for each IC design) based upon input from processes in at least one of the three Branches; and Process P608: Inspecting the IC layout using the inspection map. The inspection process can be performed on a part-by-part basis, e.g., inspecting each TMC (or group of TMCs if using a group-based rule such as a pairing analysis) to determine whether the TMC is a critical TMC.

Returning to FIG. 2, process P2 can include: forming a rule including a limit on a number of redundant connections that can be noncompliant (e.g., missing connections, undersized connections, connections with incomplete plating, connections with an imperfection or defect, or a connection failing to meet a predetermined inspection criteria) between each terminal metal connector (TMC) and a connecting surface (e.g., substrate, laminate and/or board) in the IC layout without impacting a circuit parameter. This can include establishing a threshold based upon known failure mechanisms for TMCs, e.g., a known failure rate determined to be caused by failure of one or more parameters, such as electromigration analysis of the underlying wire and TMC.

This analysis can be used to determine the maximum current that can be passed through the underlying metal line and the TMC without reliability or functionality exposure. The maximum allowed current in the underlying metal line and TMC sets an upper bound for how much current can be passed through these structures. As noted herein, if a TMC is noncompliant (missing connections, undersized connections, connections with incomplete plating, connections with an imperfection or defect, or a connection failing to meet a predetermined inspection criteria) it will pass limited or no current to the power bus. The current planned for that TMC will be rebalanced to other TMCs in the IC product. In most cases, this rebalancing will be to adjacent TMCs. In some cases, the circuit parameter can include at least one of a current limit for grouping of TMCs.

Following process P2, Process P3 can include: inspecting at least one of the IC layout or the connecting surface (e.g., board, laminate and/or substrate) to identify each TMC that violates the rule, wherein each identified TMC that violates the rule forms a second portion of the set of critical TMCs. The TMCs identified during process P3 and process P1 (identifying necessary TMCs) combined to form the set of critical TMCs in the IC layout which are prioritized over remaining TMCs in the IC layout, e.g., for inspection, verification, etc. As described herein, inspecting may be performed on a part-by-part (TMC-by-TMC) basis.

It is understood that aspects of the invention can be implemented as part of a business method that performs a process described herein on a subscription, advertising, and/or fee basis. That is, a service provider could offer to provide a critical TMC identification system as described herein. In this case, the service provider can manage (e.g., create, maintain, support, etc.) a computer system, such as computer system 102 (FIG. 1), that performs a process described herein for one or more customers. In return, the service provider can receive payment from the customer(s) under a subscription and/or fee agreement, receive payment from the sale of advertising to one or more third parties, and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

We claim:

1. A computer-implemented method for identifying a set of critical terminal metal connectors (TMCs) in an integrated circuit (IC) layout using at least one computer system, the method comprising:
    identifying a group of necessary terminal metal connectors (TMCs) in the IC layout to form a first portion of the set of critical TMCs using the at least one computer system;
    forming a rule including a limit on a number of redundant connections that can be noncompliant between each terminal metal connector (TMC) and a connecting surface in the IC layout without impacting a circuit parameter, wherein the circuit parameter includes at least one of a current limit of each TMC or an electromigration effect on each TMC; and
    inspecting at least one of the IC layout or the connecting surface to identify each TMC that violates the rule, wherein each identified TMC that violates the rule forms a second portion of the set of critical TMCs.

2. The computer-implemented method of claim 1, wherein the inspecting is implemented on a part-by-part basis on components in the IC layout.

3. The computer-implemented method of claim 1, wherein the noncompliant connection includes at least one of a missing connection, an undersized connection, a connection having incomplete plating, a connection having an imperfection or a defect, or a connection failing to meet a predetermined inspection criteria.

4. The computer-implemented method of claim 1, wherein the identifying of the group of necessary TMCs includes at least one of identifying each necessary TMC using an exposure limit approach, identifying each necessary TMC using an electrical analysis approach, or identifying each necessary TMC using a minimum metal width approach.

5. The computer-implemented method of claim 1, wherein the forming of the rule including the limit is performed after the identifying of the group of necessary TMCs.

6. The computer-implemented method of claim 1, wherein the connecting surface includes at least one of a substrate surface, a laminate surface, or a board surface.

7. A computer program product comprising program code fixed in a non-transitory computer-readable medium, which when executed on at least one computing device, causes the at least one computing device to identify a set of critical terminal metal connectors (TMCs) in an integrated circuit (IC) layout by performing actions including:
    identifying a group of necessary terminal metal connectors (TMCs) in the IC layout to form a first portion of the set of critical TMCs;
    forming a rule including a limit on a number of redundant connections that can be noncompliant between each terminal metal connector (TMC) and a connecting surface in the IC layout without impacting a circuit parameter, wherein the circuit parameter includes at least one of a current limit of each TMC or an electromigration effect on each TMC; and
    inspecting at least one of the IC layout or the connecting surface to identify each TMC that violates the rule, wherein each identified TMC that violates the rule forms a second portion of the set of critical TMCs.

8. The computer program product of claim 7, wherein the inspecting is implemented on a part-by-part basis on components in the IC layout.

9. The computer program product of claim 7, wherein the noncompliant connection includes at least one of a missing connection, an undersized connection, a connection having incomplete plating, a connection having an imperfection or a defect, or a connection failing to meet a predetermined inspection criteria.

10. The computer program product of claim 7, wherein the identifying of the group of necessary TMCs includes at least one of identifying each necessary TMC using an exposure limit approach, identifying each necessary TMC using an electrical analysis approach, or identifying each necessary TMC using a minimum metal width approach.

11. The computer program product of claim 7, wherein the forming of the rule including the limit is performed after the identifying of the group of necessary TMCs.

12. The computer program product of claim 7, wherein the connecting surface includes at least one of a substrate surface, a laminate surface, or a board surface.

13. A system comprising:
   at least one computing device configured to identify a set of critical terminal metal connectors (TMCs) in an integrated circuit (IC) layout by performing actions including:
      identifying a group of necessary terminal metal connectors (TMCs) in the IC layout to form a first portion of the set of critical TMCs;
      forming a rule including a limit on a number of redundant connections that can be noncompliant between each terminal metal connector (TMC) and a connecting surface in the IC layout without impacting a circuit parameter,
         wherein the circuit parameter includes at least one of a current limit of each TMC or an electromigration effect on each TMC; and
      inspecting at least one of the IC layout or the connecting surface to identify each TMC that violates the rule, wherein each identified TMC that violates the rule forms a second portion of the set of critical TMCs.

14. The system of claim 13, wherein the inspecting is implemented on a part-by-part basis on components in the IC layout.

15. The system of claim 13, wherein the noncompliant connection includes at least one of a missing connection, an undersized connection, a connection having incomplete plating, a connection having an imperfection or a defect, or a connection failing to meet a predetermined inspection criteria.

16. The system of claim 13, wherein the identifying of the group of necessary TMCs includes at least one of identifying each necessary TMC using an exposure limit approach, identifying each necessary TMC using an electrical analysis approach, or identifying each necessary TMC using a minimum metal width approach.

17. The system of claim 13, wherein the forming of the rule including the limit is performed after the identifying of the group of necessary TMCs, and
   wherein the connecting surface includes at least one of a substrate surface, a laminate surface, or a board surface.

* * * * *